(12) United States Patent
Moe et al.

(10) Patent No.: US 7,827,516 B1
(45) Date of Patent: Nov. 2, 2010

(54) METHOD AND SYSTEM FOR GROUPING LOGIC IN AN INTEGRATED CIRCUIT DESIGN TO MINIMIZE NUMBER OF TRANSISTORS AND NUMBER OF UNIQUE GEOMETRY PATTERNS

(75) Inventors: Matthew D. Moe, Pittsburgh, PA (US); Lawrence T. Pileggi, Pittsburgh, PA (US); Vyacheslav V. Rovner, Pittsburgh, PA (US); Thiago Hersan, Pittsburgh, PA (US); Dipti Motiani, Santa Clara, CA (US); Veerbhan Kheterpal, Sunnyvale, CA (US)

(73) Assignee: PDF Solutions, Inc., San Jose, CA (US)

( * ) Notice: Subject to any disclaimer, the term of this patent is extended or adjusted under 35 U.S.C. 154(b) by 51 days.

(21) Appl. No.: 11/969,214

(22) Filed: Jan. 3, 2008

Related U.S. Application Data

(63) Continuation-in-part of application No. 11/619,587, filed on Jan. 3, 2007, now Pat. No. 7,784,013.

(60) Provisional application No. 60/883,332, filed on Jan. 3, 2007.

(51) Int. Cl.
*G06F 17/50* (2006.01)
*H03K 19/00* (2006.01)
(52) U.S. Cl. .......................... 716/17; 716/18
(58) Field of Classification Search .................. 716/17, 716/18
See application file for complete search history.

(56) References Cited

U.S. PATENT DOCUMENTS

| | | | |
|---|---|---|---|
| 5,682,323 A | 10/1997 | Pasch et al. | |
| 6,505,332 B1 | 1/2003 | Oda | |
| 6,892,373 B2 | 5/2005 | Whitaker et al. | |
| 7,078,971 B2 * | 7/2006 | Colbeck | 330/255 |
| 7,278,118 B2 | 10/2007 | Pileggi et al. | |
| 2003/0149953 A1 | 8/2003 | Whitaker et al. | |
| 2006/0189049 A1 * | 8/2006 | Afentakis et al. | 438/151 |

OTHER PUBLICATIONS

Nakamura, et al., "Minimal Negative Gate Networks", *IEEE Transactions on Computers*, C-21(1): 5-11, Jan. 1972, block 720.

* cited by examiner

*Primary Examiner*—Stacy A Whitmore
*Assistant Examiner*—Magid Y Dimyan
(74) *Attorney, Agent, or Firm*—Pillsbury Winthrop et al

(57) ABSTRACT

A method and system are described to group logic terms at a higher level of abstraction than that found using standard cells to implement the logic functions using a reduced number of transistors, and to reduce the total number of unique geometry patterns needed to create the integrated circuit implementation. By grouping the logic functions in terms of a larger number of literals (logic variable inputs), the functions can be implemented in terms of a number of transistors that is often less and no more than equal to that which is required for implementing the same function with a number of logic primitives, or simpler standard logic cells. The optimized transistor level designs are further optimized and physically constructed to reduce the total number of unique geometry patterns required to implement the integrated circuit.

18 Claims, 16 Drawing Sheets

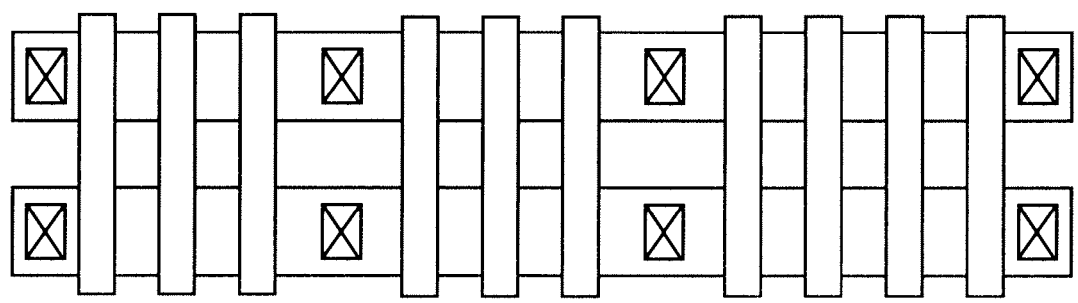
FIG. 5  PRIOR ART
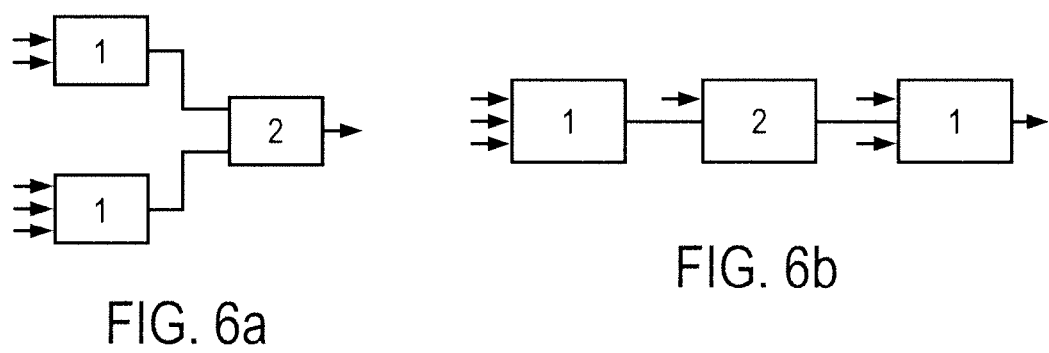
FIG. 6a
FIG. 6b $\overline{F} = a.b.c + d$ $\overline{F} = a + b.(c + d.e)$ $\overline{F} = a.b.(c + d)$

METHOD AND SYSTEM FOR GROUPING LOGIC IN AN INTEGRATED CIRCUIT DESIGN TO MINIMIZE NUMBER OF TRANSISTORS AND NUMBER OF UNIQUE GEOMETRY PATTERNS

CROSS-REFERENCE TO RELATED APPLICATIONS

The present invention is a continuation-in-part of U.S. application Ser. No. 11/619,587 filed Jan. 3, 2007 now U.S. Pat. No. 7,784,013 entitled "Method for the Definition of a Library of Application-Domain-Specific Logic Cells" and claims priority to U.S. Provisional Application No. 60/883,332 filed Jan. 3, 2007 entitled "A Method and System For Grouping Logic in an Integrated Circuit Design to Minimize Number of Transistors and Number of Unique Geometry Patterns," both of which are incorporated by reference herein in their entirety.

FIELD OF THE INVENTION

The present invention relates to a method and system for grouping logic in an integrated circuit design to minimize number of transistors and number of unique geometry patterns.

BACKGROUND OF THE RELATED ART

Carnegie Mellon University has published research that describes grouping of logic into macro-regular "bricks" to allow the use of pushed design rules within the bricks. U.S. Pat. No. 7,278,118 entitled "Method and Process For Design of Integrated Circuits Using Regular Geometry Patterns to Obtain Geometrically Consistent Component Features" describes other aspects of such bricks.

While the invention in the '118 patent and other pending applications of the current assignee set forth advantageous aspects relating to the creation of such logic bricks, refinements and advances continue, and some of those are described herein.

SUMMARY OF THE INVENTION

The present invention relates to a method and system for grouping logic in an integrated circuit design to minimize number of transistors and number of unique geometry patterns.

In one aspect, there is described a method of determining a logic brick that contains a non-standard complex Boolean logic function that has at least three inputs that includes determining a circuit that implements the non-standard complex Boolean logic function, the step of determining including the step of identifying transistors, associated connections and the at least three inputs to implement the circuit, the step of identifying reducing a number of the transistors to be a fewest possible that satisfy predetermined logic, layout and electrical constraints; and determining a layout for the circuit to specify the logic brick.

In a preferred embodiment the step of determining the circuit can have a number of different aspects, examples of which include:
  restricting the circuit to a stack depth of no more than 3;
  using a minimal negative gate algorithm;
  using a recursive decomposition to select an output function for the circuit wherein a stack height of the output function is no more than 2;
  using a recursive decomposition and a template matching, wherein the template matching requires that the circuit is substantially obtained from design templates used in the template matching, and wherein each of the design templates are restricted to having a stack depth of no more than 3.

In another aspect, the invention reduces a number of the transistors to be the fewest possible.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein:

FIG. 5 illustrates a conventional fixed pitch polysilicon fabric;

FIGS. 6(a)-(b) illustrate two examples of circuits that have a different stack depth;

DETAILED DESCRIPTION OF THE PREFERRED EMBODIMENTS

IC design with increased regularity for manufacturability can incur a penalty in terms of area and performance. It is important, therefore, to exploit this regularity with circuits and methodologies that can overcome some or all of these penalties. Exploiting the large logic functions that are grouped for macro-regularity to reduce the number of transistors required to perform one or more logic functions on the chip can provide a significant improvement in both area and performance. Improvements in IC area and performance are of great commercial value in all IC application domains.

A method and system are described that assist with obtaining this regularity, and in one aspect to group logic terms at a higher level of abstraction than that found using standard cells to implement the logic functions using a reduced number of transistors, and to reduce the total number of unique geometry patterns needed to create the integrated circuit implementation. This description is considered in conjunction with U.S. application Ser. No. 11/619,587 filed Jan. 3, 2007 entitled "Method for the Definition of a Library of Application-Domain-Specific Logic Cells" and U.S. Pat. No. 7,278,118 entitled "Method and Process For Design of Integrated Circuits Using Regular Geometry Patterns to Obtain Geometrically Consistent Component Features," filed Nov. 5, 2005, which applications are hereby expressly incorporated by reference herein. By geometry patterns is meant an arrangement of patterns for the masks which define a physical implementation of a transistors, logic cells, logic bricks, etc. The area covered by such patterns can be of any size or shape, but for this invention we are referring to the set of patterns which would lie within a circle that defines the range of influence between patterns for lithography (e.g. impacts OPC and RETS) or electrical interaction (e.g. stress).

Figure 1:
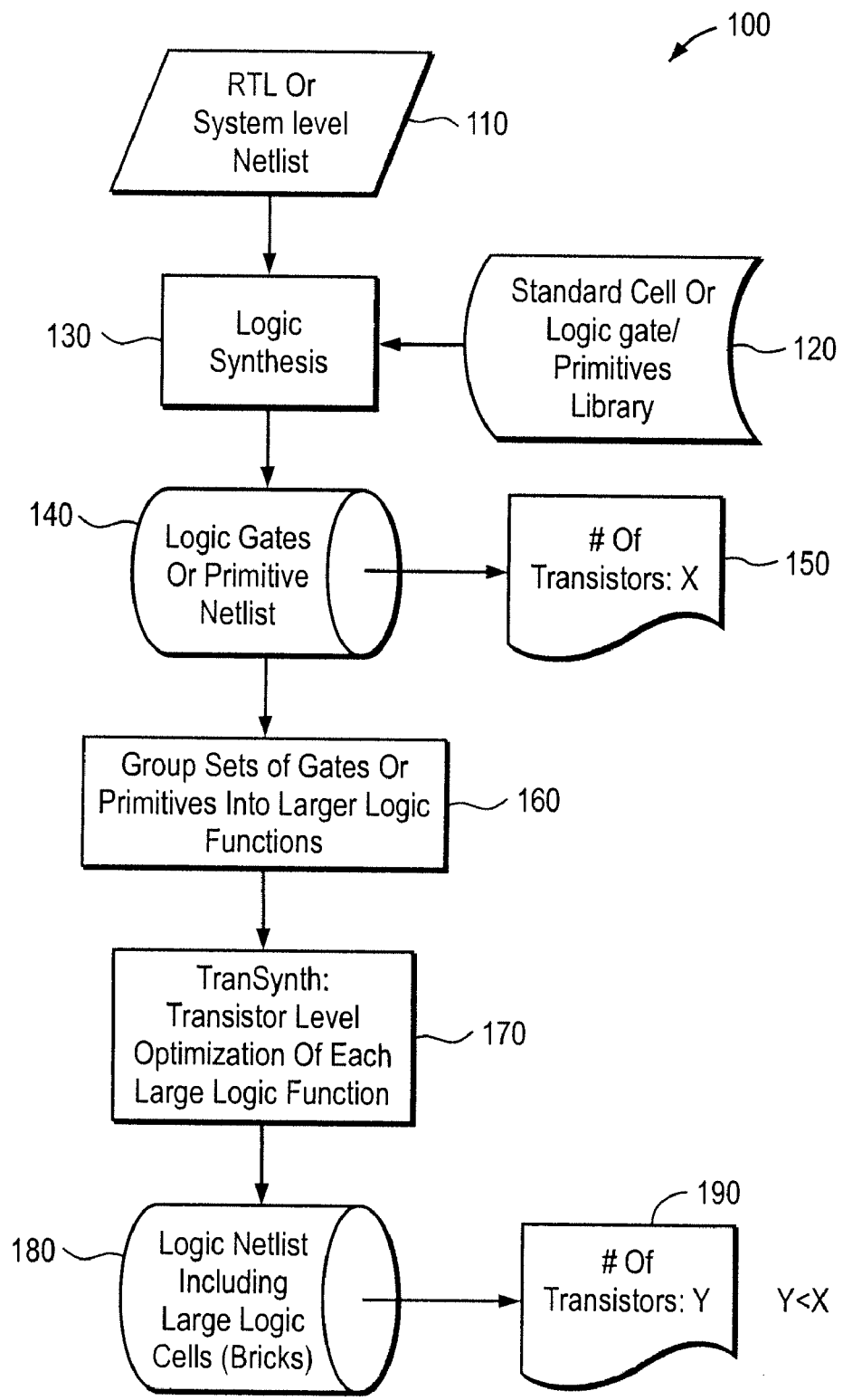
FIG. 1 an overview flow diagram of the present invention.

Referring to FIG. 1, this invention begins with taking one or more system level netlists, such as those described at the RTL (register transfer level), and deriving the set of non-standard complex Boolean logic functions, herein referred to as logic bricks. One possible objective would be to find the set of non-standard complex Boolean logic functions that implement the design to meet all specifications, but with the fewest number of such logic bricks. One goal of such a methodology is to reduce the total number of unique geometry patterns required to implement the system or design. In such as design flow, these logic bricks can be physically implemented using a number of standard cells, but the invention described herein optimally implements these logic bricks by finding the best transistor level topology, sizing and interconnections that will provide for a superior power, delay and or physical area brick implementation.

Specifically with reference to the flowchart in FIG. 1, The library contained in 120 can be a complete standard cell library or a limited set of standard cells or logic primitives that form a sufficient set to derive the set of large logic functions in Step 160. In Step 130 the RTL netlist or netlists of Step 110 are synthesized using a logic synthesis tool and the library from Step 120 to produce a netlist in 140 in terms of the logic gates from the library of 120. At this point the number of transistors used to implement the netlist or netlists can be counted in Step 150. One or more logic gates can then be grouped into larger functions (sometimes referred to as bricks) in Step 160. Our preferred method for Step 160 is detailed in the U.S. application Ser. No. 11/619,587, referred to previously. The individual TL bricks can then each be synthesized directly into a transistor level implementation using TranSynth as part of Step 170. In Step 180 the newly re-synthesized bricks are substituted for the equivalent logic gates in the original netlist. In Step 190 the number of transistors in the netlist is once again counted. The number of transistors in the netlist at Step 180 will have less transistors than the netlist at Step 140.

With this overall description, further particulars will now be provided.

Brick Discovery is the process of finding a limited set of Boolean functions, some of which are non-standard complex Boolean logic functions that most efficiently implement a design. Integral to this process is the evaluation of a single Boolean function in terms of transistor level efficiency. Transistor Level Synthesis (henceforth referred to as TranSynth), is the process by which a Logical Brick, which is the logic and/or physical representation of a non-standard complex Boolean logic function, is transformed into a set of transistor-based logical gates, called a Transistor Level Brick (henceforth referred to as a TL Brick). The transformation process includes gate level synthesis, netlist generation and transistor sizing. Once transformed, these TL Bricks can be evaluated in terms of performance, area and power. Without these runtime evaluations during Brick Discovery, the chosen Logical Bricks could result in a design implementation that is significantly inferior to that which is otherwise possible.

Figure 2:
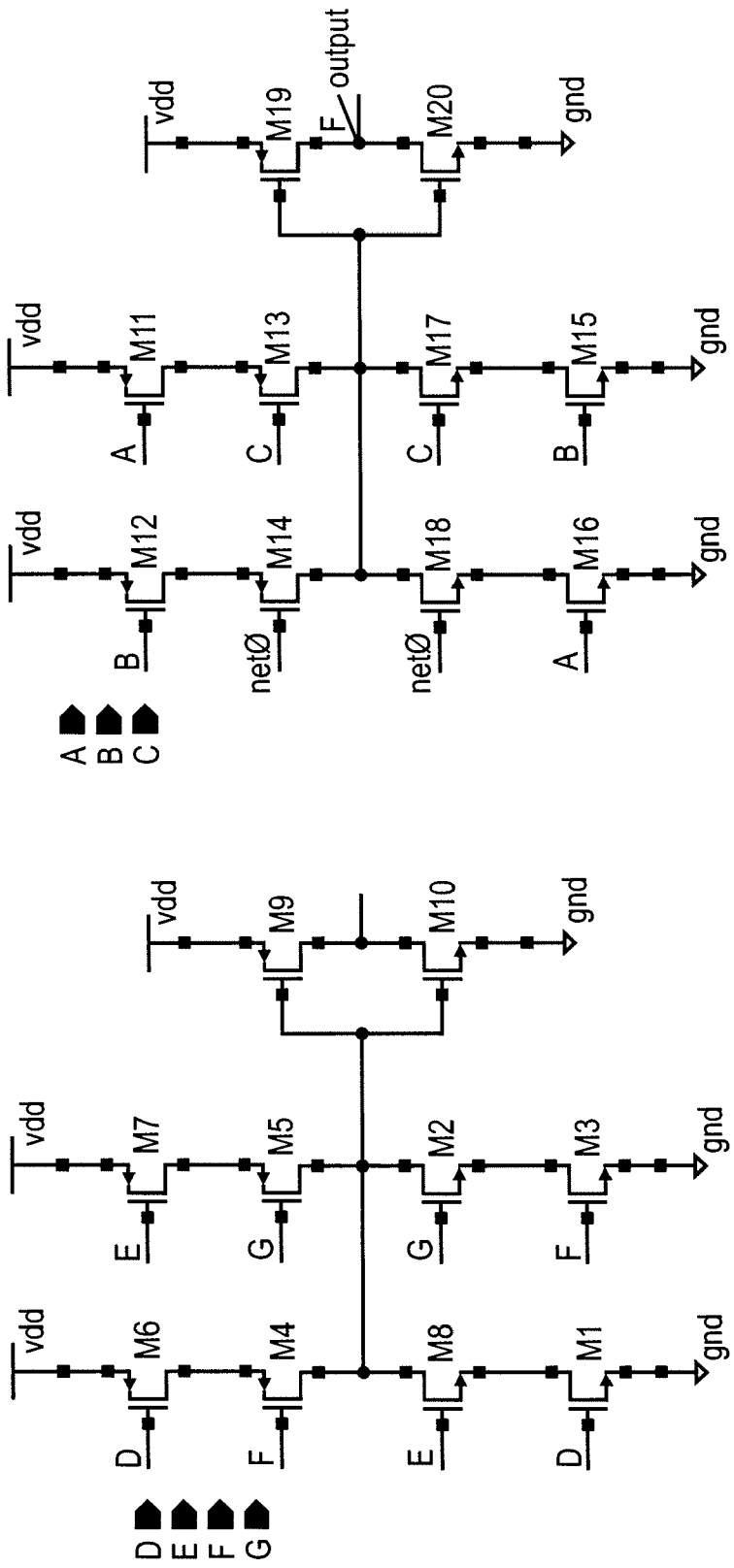
FIG. 2 illustrates an example of a logic function implemented with standard cell functions.

By grouping the logic functions into bricks that are based on functions with a large number of literals (input logic variables), the TL brick implementation of those functions can be implemented in terms of a number of transistors that is often less than, and guaranteed to be no worse than equal to, that which is required for implementing the same function with a number of logic primitives, such as standard cells. As an example, consider the logic function A(DE+FG)+BC, which is an example of a 7-term logic brick. Implementation via standard cells is extremely efficient for this function in terms of two AO22's (standard cell AND-ORs). The transistor-level schematic for this standard-cell-based implementation is shown in FIG. 2. It is comprised of 20 transistors and requires 4 stages of logic to implement the function A(DE+FG)+BC.

Figure 3:
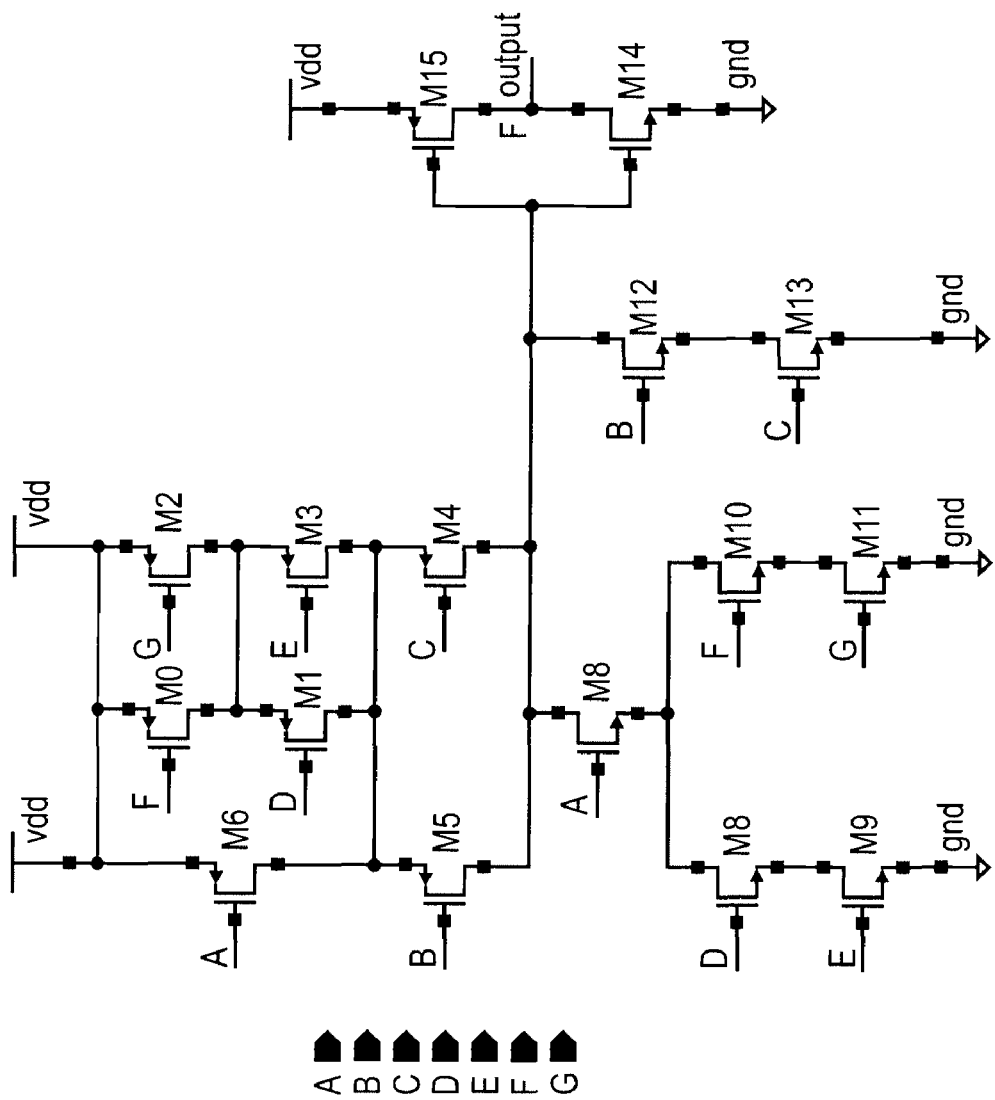
FIG. 3 illustrates an example of the logic function of FIG. 2 implemented with a transistor level optimized brick according to one embodiment of the present invention.

In contrast, consider the transistor-level optimized implementation of a single TL brick for the same function, A(DE+FG)+BC, as shown in schematic form in FIG. 3. This implementation requires only 16 transistors, and only 2 stages of logic.

This optimization of logic functions, such as logical or TL bricks, can be performed for any size logic function, but in this invention it is intended for complex functions in the range of 3-12 inputs. Moreover, this invention as described in FIG. 1, includes taking one or more system-level or design-level (such as RTL) netlists and deriving a set of TL bricks and corresponding transistor-level optimizations of said TL bricks that will facilitate implementation of the netlist with a fewer total number of transistors. Optimization of logic is also achieved by choosing a logic family that does NOT include pass transistors because they are inefficiently laid out in the unidirectional pattern fabrics (those with patterns in each layer only in one direction.

By reducing the number of transistors, the complete logic design can be implemented more efficiently in terms of power, area and performance (including timing). Furthermore, by grouping the logic into TL bricks that are larger than typical standard cells, further improvement in area and performance is obtained by optimizing the physical implementation (layout) of the transistor-level optimized functions. This invention further considers the co-optimization of the layout and transistor level topology and sizing to achieve the best possible area, power and performance. This optimization could include the minimization or reduction in the total number of geometry patterns required to implement the design.

Figure 4B:
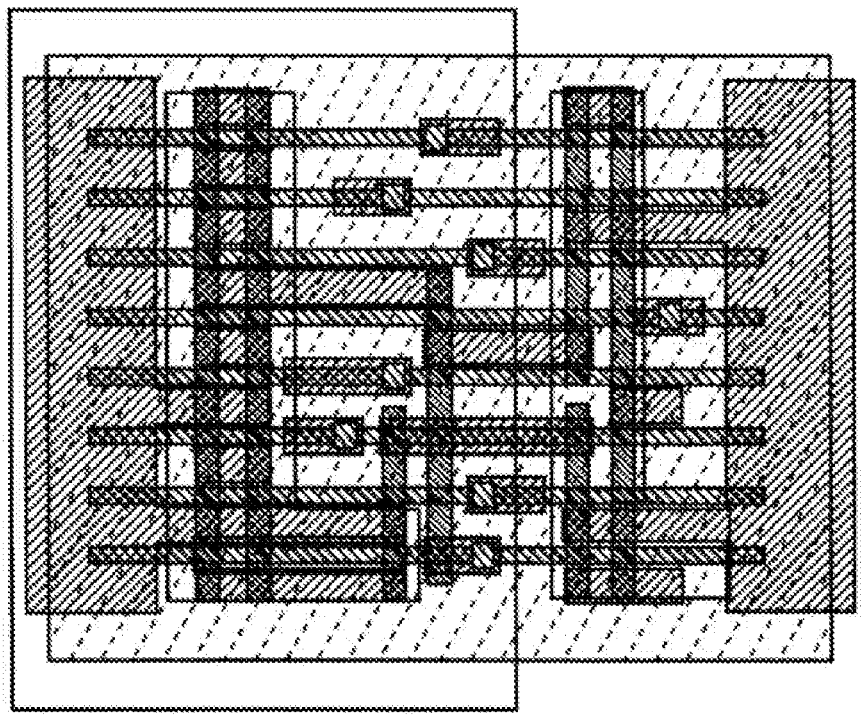
FIGS. 4(a)-(b) illustrate footprints of a conventional standard cell and a transistor level optimized brick according to the present invention, respectively.
Figure 4A:
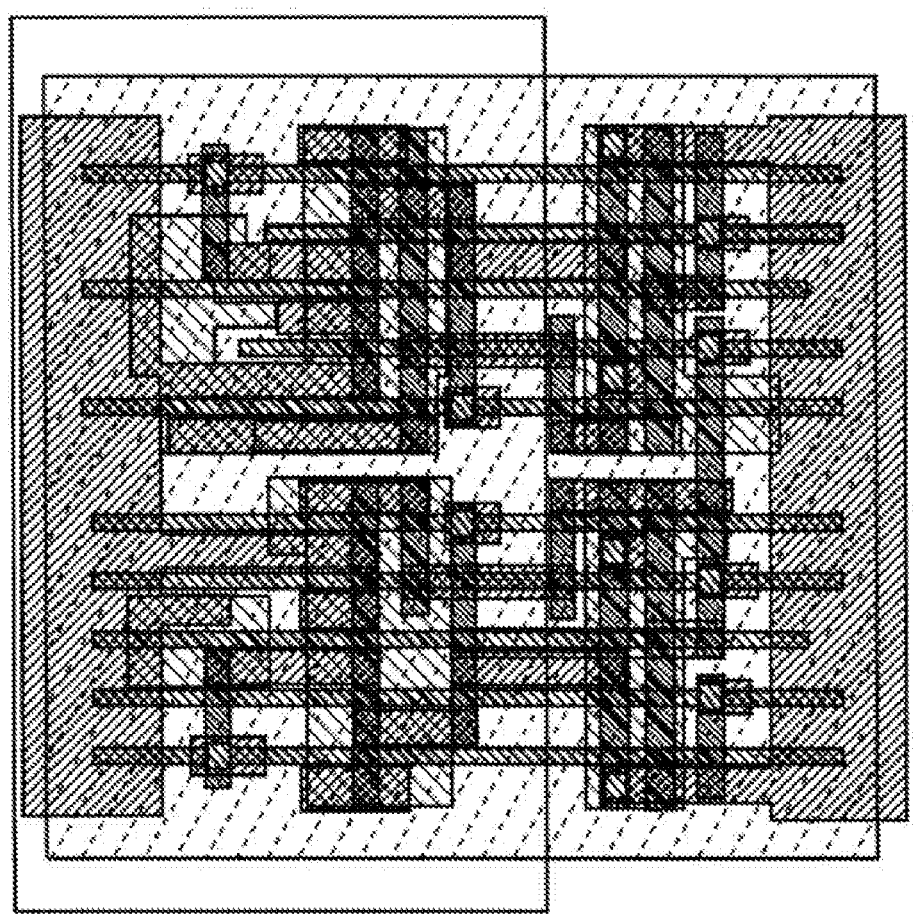

One such layout optimization is to merge diffusions between neighboring transistors to avoid the need to make a connection between them. For example, the physical implementation of A(DE+FG)+BC based on standard cells (FIG. 2), is shown in FIG. 4 (left). The physical implementation of A(DE+FG)+BC based on a single transistor-level optimized brick (FIG. 3, is shown in FIG. 4 (right). Note that the TL brick footprint is 25% smaller than that for the standard cell implementation based on the use of the same regular pattern design rules for both. This improvement in footprint is attributable to both the reduced number of transistors, as well as the ability to better order those transistors for diffusion sharing and other physical layout improvements.

By following this design flow, one can reduce the total number of transistors required to implement a system-level or design-level logic description, and further reduce the total number of unique geometry patterns that are required for that implementation. Further specifics regarding this design flow will now be described.

TranSynth Metrics

The two fundamental metrics used within TranSynth are Area and Stage Depth. In a regular Fabric such as that shown in FIG. 5, where the gates occur only at a fixed pitch, a lower bound area estimate is Transistor Count*Gate Pitch*Brick Height/2. More accurate area estimation is achievable through the use of design templates, which are described later in the TranSynth-3 section. In terms of area, savings of area is also achieved by the avoidance of interconnected transistors that will require so much routing that for a particular fabric there is the need to skip a track where a transistor could be located (for example, with pass transistors).

The other fundamental metric—Stack Depth, is measured as the maximum number of gates traversed from inputs to output. With all other things being equal, stage depth shortening will result in a faster design because of a reduction in intermediate node capacitance. FIGS. 6(a)-(b) shows an example of how Stack Depth is measured in two possible implementations. If choosing between these two implementations, the implementation of FIG. 6(a) on the left is likely to be faster than the implementation of FIG. 6(b) on the right because of the shorter Stack Depth.

TranSynth Constraints

The transistor level synthesis process will generate the implementation with the fewest number of transistors that are required to implement the logic function and satisfy a number of electrical, layout and logical constraints. Sometimes these constraints create conflicting goals for TranSynth.

Stack height, which defines the number of series connected NFET or PFET devices in a logic cell or brick, has a logical impact, but also is constrained in terms of electrical performance requirements. High stack heights create large stack resistances that limit leakage power, but also limit the performance. The stack height constraint is carefully chosen to balance logic efficiency, leakage power, and timing. For example, in modern CMOS technologies, stack heights of more than 3 MOSFETs are generally not used because the switching performance will be degraded too severely. Electrical constraints also have an impact on layout and logic efficiency. For example, logic cells that have a high internal and output capacitance can be undesirable for power and delay reasons, i.e. AOI333 or OAI333, and other such cells, as are known. Such logic cells are often not used as part of the library for these reasons, even though their non-use can cause an increase in the overall block or IC layout area due to a reduction in efficiency for the mapping of the RTL design into the netlist of library elements.

Layout constraints such as cell height, cell area and limited pattern choices (based on lithography or manufacturability considerations) can have both electrical and logical impacts. Namely, there can be limitations on the choice of logic family and/or the sizes for the transistors within the cells. Patterning choices such as unidirectionality (all patterns oriented in vertical or horizontal direction only) and pitch selection (wire widths and spacings) of various layers make certain logic families area inefficient and undesirable. Transistor sizes in the final netlist are constrained not only by the patterning choices but also by the cell height. These layout constraints impact both the leakage power and logic efficiency.

Importantly, a central portion of the TranSynth methodology is to efficiently and effectively co-optimize the number of transistors subject to these constraints.

TranSynth-1

Figure 7:
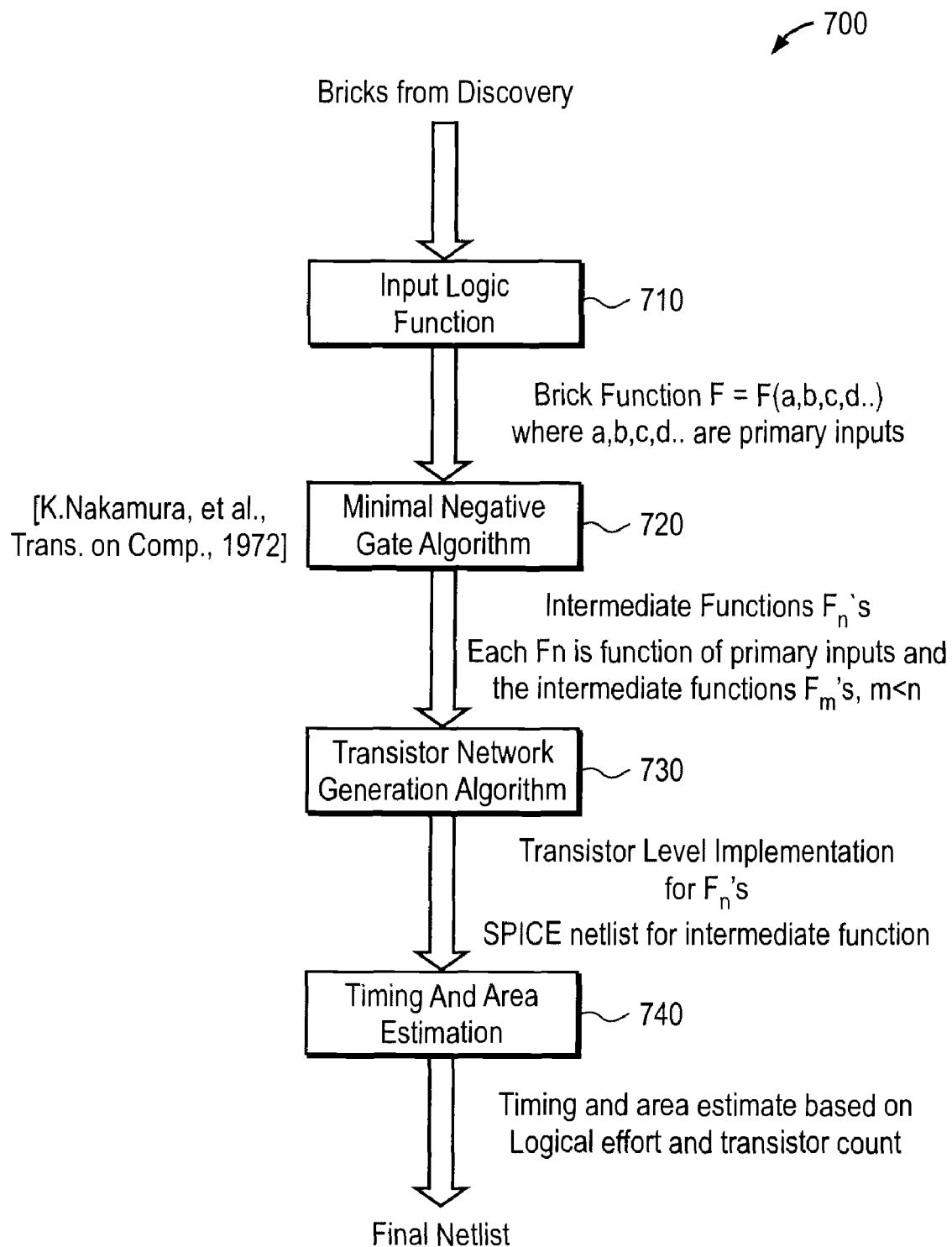
FIG. 7 shows an overview of one transistor level synthesis algorithm flowchart according to one embodiment of the present invention.

FIG. 7 shows one method 700, referred to as TranSynth-1, of turning a Logical Brick into a TL Brick. Each Logical Brick, shown as the input logic function in block 710, is transformed into a series of logical gates using Nakamura's Minimal Negative Gate Algorithm, described in K. Nakamura, N. Tokura, and T. Kasami. "Minimal Negative Gate Networks." IEEE Transactions on Computers, C-21(1):5—11, January 1972 and shown at block 720. The logical gate level netlist obtained is then transformed into a static CMOS transistor level netlist using simple substitution, as shown at block 730. Transistor sizing and timing estimation use a logical effort based algorithm, as shown at block 740. As discussed earlier, a lower bound area estimate can be derived from the transistor count. The final result is either a TL Brick netlist suitable for further implementation or an area and timing estimate which can be used within Brick Discovery. The next few sections describe each of these tasks in more detail.

Minimal Negative Gate Algorithm

Figure 8:
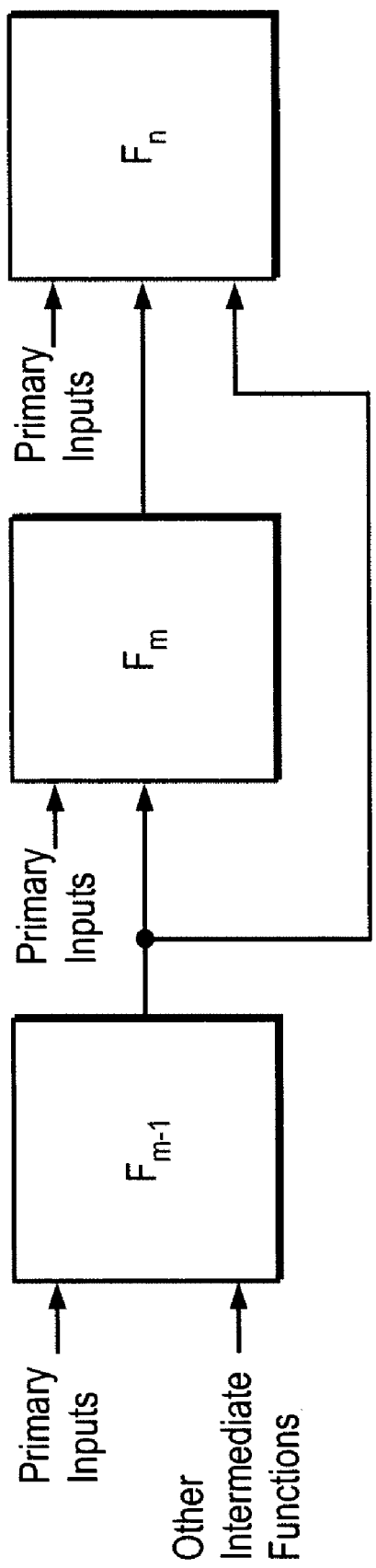
FIG. 8 illustrates a minimal gate transformation according to one embodiment of the present invention.

Nakamura's Minimal Gate Algorithm, shown at block 720 in FIG. 7, transforms a Boolean function—F(a,b,c,d, . . . ), where a, b, c, d, etc. are Primary Inputs to the function, into a series of intermediate functions—$F_m$(a,b,c,d, . . . ). Each $F_n$, is a function of the primary inputs and other intermediate functions $F_m$'s, where m<n as shown in FIG. 8.

Figure 9:
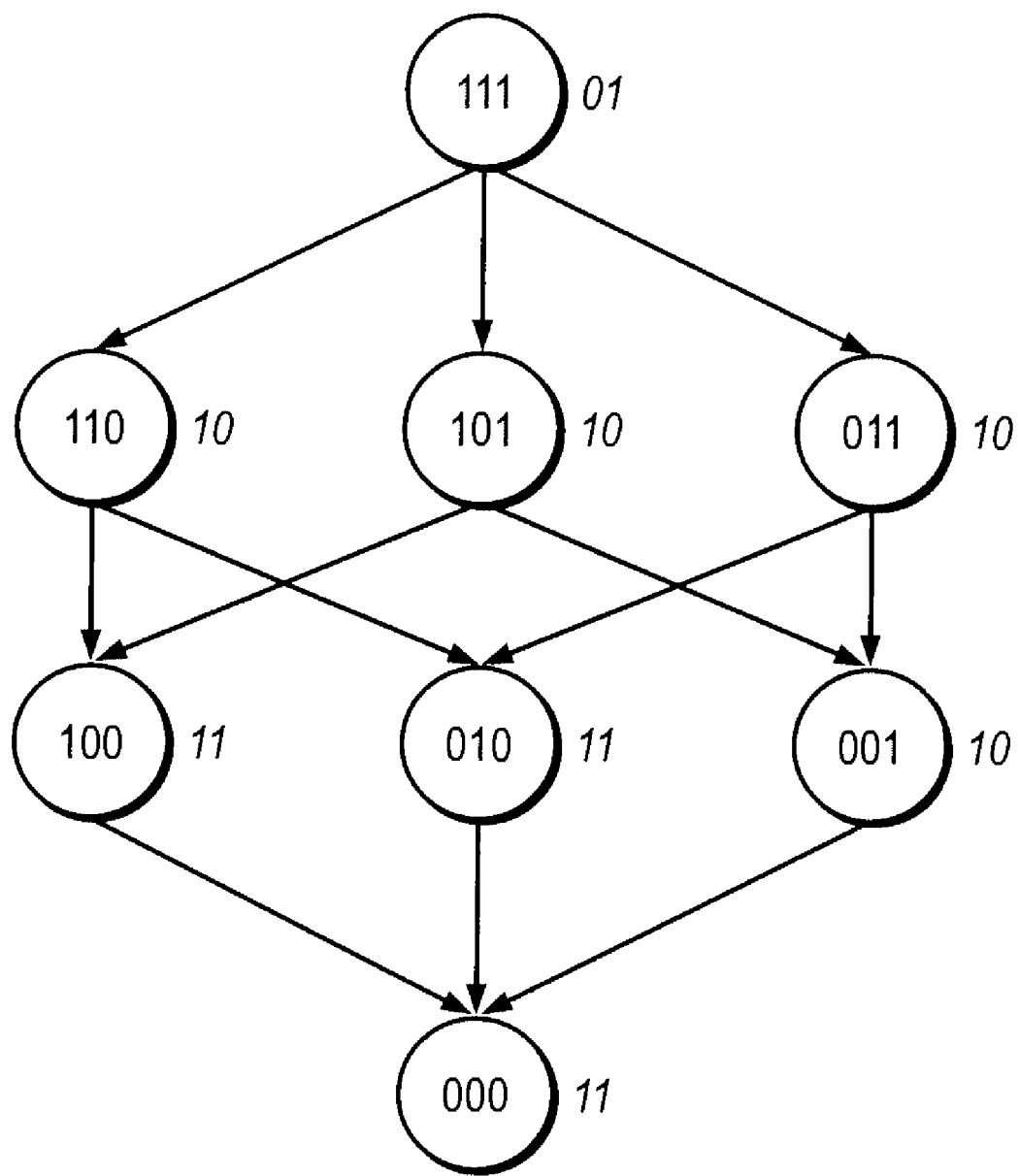
FIG. 9 illustrates encoding using a directed graph according to one embodiment of the present invention.

The $F_m$s are derived by encoding binate functions in a directed graph as shown in FIG. 9 for the example function a'c'+b'c'+abc. Directed connections in the graph are placed between minterms that have a Gray's Code distance of 1—the minterm values differ by only 1 bit. Labels are assigned to each minterm such that the Least Significant Bit (LSB) is the function value and the labels between connected minterms are monotonically increasing.

The Most Significant Bit (MSB) in the labels becomes the function values for $F_0$ given only the primary inputs. The next MSB in the labels becomes the function values for the $F_1$ function given the primary inputs and $F_0$ as inputs to the function. This continues until the function $F_n$ is derived from the LSBs in the labels as a function of the primary inputs and all of the previously evaluated intermediate functions.

Nakamura's algorithm only shows how to find an implementation of a function in the minimum number of logic gates. The algorithm does not address transistor count minimization or stack height restrictions—two of the goals of the TranSynth algorithm.

In order to find an implementation with the minimum number of transistors with a stack height restriction, a large solution space must be explored. There are two main causes of the large solution space—Don't Care selection and Label Assignment. Each $F_n$, except for n equal to 0, is an incompletely specified function. As the n index increases, so does the Don't Care solution space because proportionally more minterms of the function have values that are unspecified. Finding the right set of Don't Cares that minimizes transistor count for each gate is not trivial. The current implementation exhaustively searches the solution space. Published Boolean minimization algorithms may not give an optimal transistor count.

In the label assignment process, each directed connection has a label value that is monotonically increasing. There are sometimes many label values that will satisfy this constraint. Exhaustive search of this solution space is necessary to guarantee optimality. The current solution for design space exploration utilizes a branch and bound algorithm based on transistor count. The addition of stack height constraints makes finding any solution difficult for some functions. Without an initial solution, the branch and bound algorithm must explore the entire design space. Some functions are not implementable in the minimum number of gates given a stack height constraint which results in long runtimes and no solution.

Figure 10:
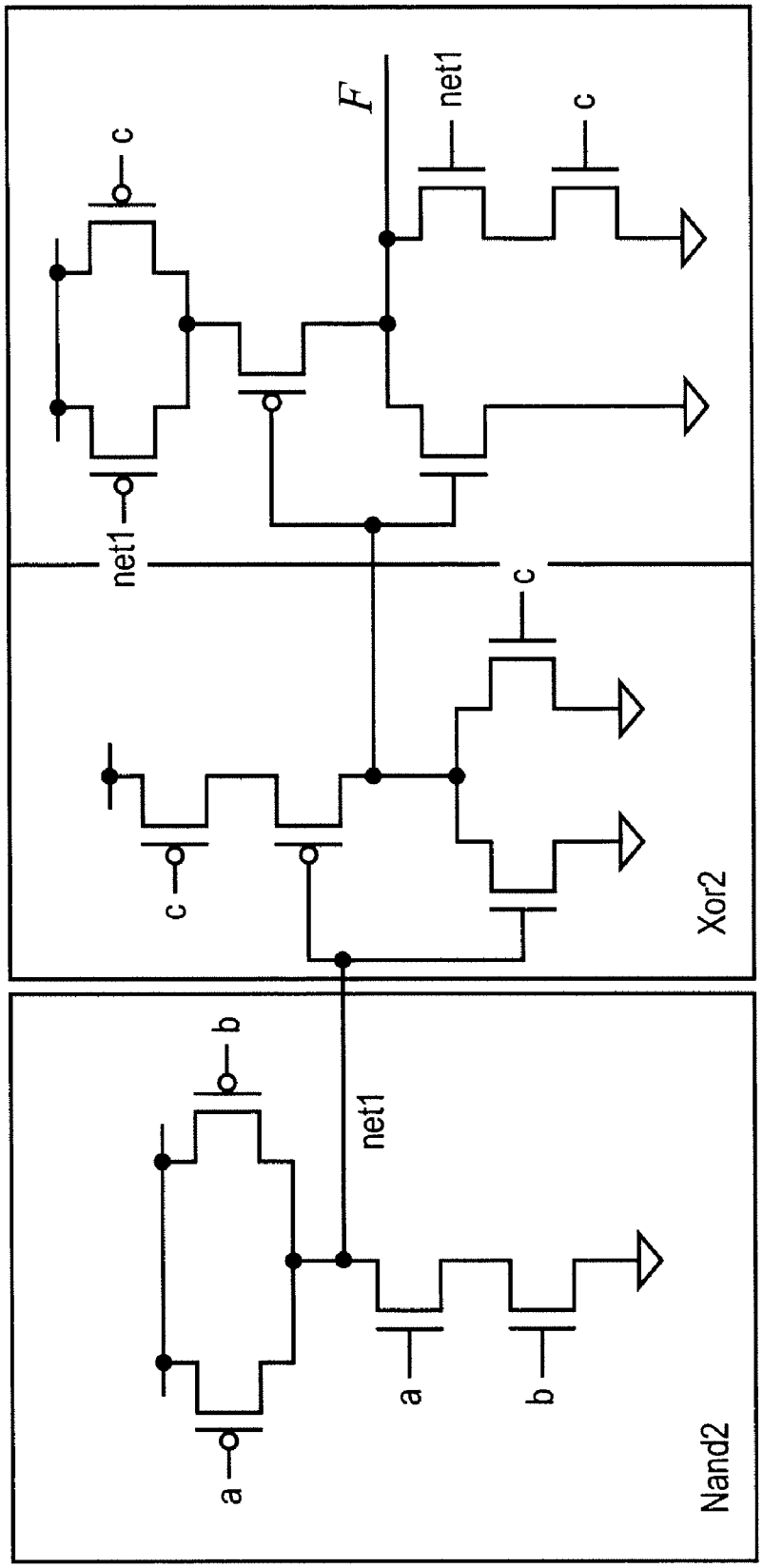
FIG. 10 illustrates an optimized standard cell implementation obtained using a conventional design process

FIG. 10 shows the optimized implementation in terms of standard cells (or standard logic primitives) for the function a'c'+b'c'+abc.

Figure 11:
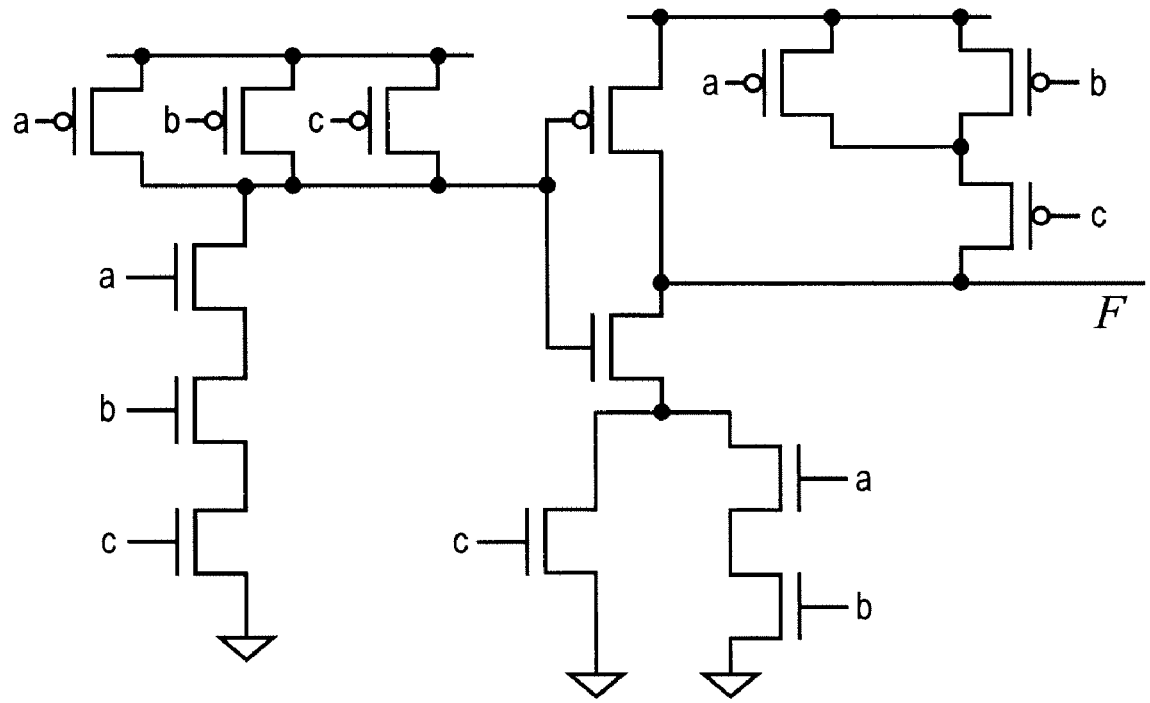
FIG. 11 illustrates an optimized standard cell implementation obtained using a transistor level synthesis algorithm according to the embodiment of the present invention described with respect to FIG. 7 above.

FIG. 11 shows the CMOS implementation for the same function following TranSynth-1 without any stack height restrictions.

Compared to the optimized standard cell implementation, TranSynth-1 is able to reduce the number the stages from 3 to 2 without impacting the transistor count. The reduced stage depth will translate into a faster implementation.

TranSynth-2

Figure 12:
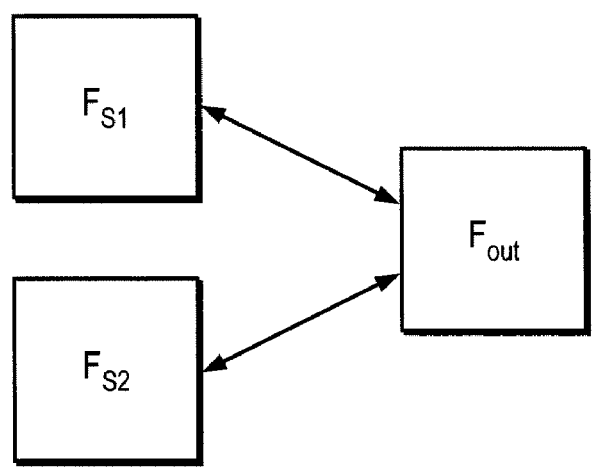
FIG. 12 illustrates recursive decomposition according to one embodiment of the present invention.

A further refinement, and one way of decreasing the search space and resultant runtime found in TranSynth-1, is to recursively decompose the Boolean functions (into sub-functions driving an output function) through algebraic tree decomposition before applying the TranSynth-1 methodology, as shown in FIG. 12.

Figure 13A:
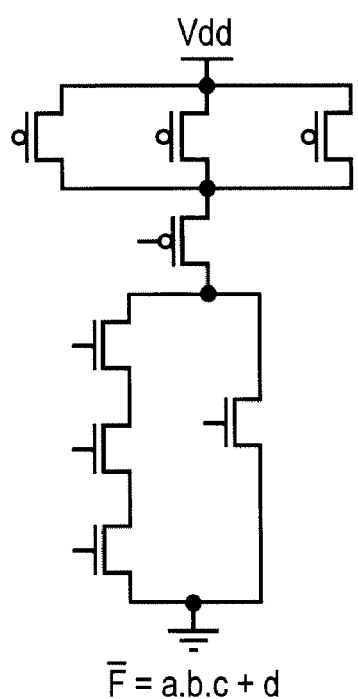
FIG. 13 illustrates examples of Boolean functions recursively decomposed into sub-functions that drive an output function according to the present invention.
Figure 13B:
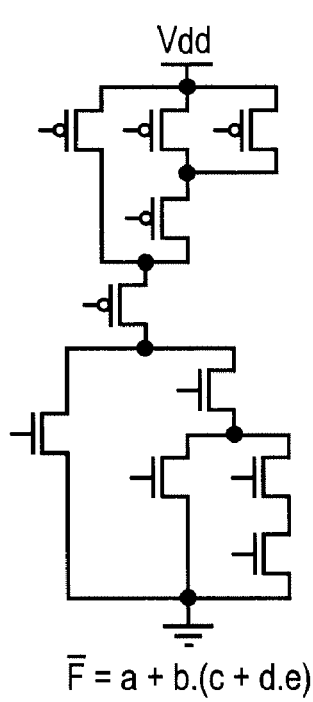
Figure 13C:
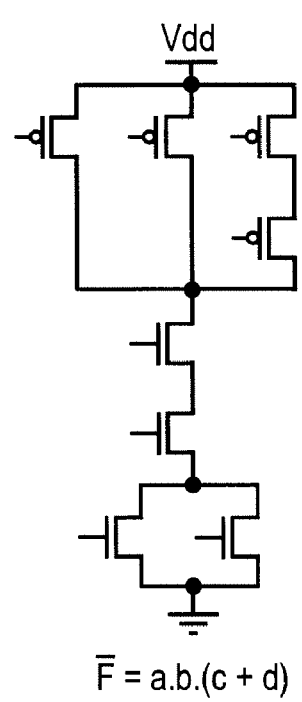

In tree decomposition, only logical gates with a tree structure like that shown in FIG. 13 are possible.

Transistor stack height restrictions help speedup the decomposition by limiting the number of possible logic gates at each stage of the recursion. With a stack height of 2, there are only 7 possible gates as the final output gate—INV, NAND2, NOR2, AOI21, AOI22, OAI21, OAI22. With a stack height of 3, the present inventors have identified that there are only 67 possible logical gates in tree decomposition. With a stack height of 4 there is still a limited number of functions, and not all of those necessarily are needed—just as not all of the 69 functions are needed to implement TL bricks if the stack height is limited to 3. Limiting the stack height is a performance constraint, and by limiting the stack height this limits the total number of possible combinations. By having a reduced set of combination, this allows characterization of those combinations, and can then lead to simplification of the overall design of integrated circuits, since with the limited number of functions the more limited number of combinations makes it easier to characterize them—particularly since from these useful Boolean functions an almost limitless set of TL bricks can be built. There is some loss of optimality in the search space reduction of TranSynth-2, but there is also a significant reduction in runtime when utilizing TranSynth-2 compared to TranSynth-1 for certain complex functions. Embedded XOR decompositions are only found because they are explicitly searched for. Other similar structures are not found. It is noted that Transynth-1 can search for the best solution. Transynth-2 simplifies the search space a bit by first decomposing a large function. This will improve the search efficiency, but it can result in a solution that is inferior to that from Transynth-1.

Figure 14:
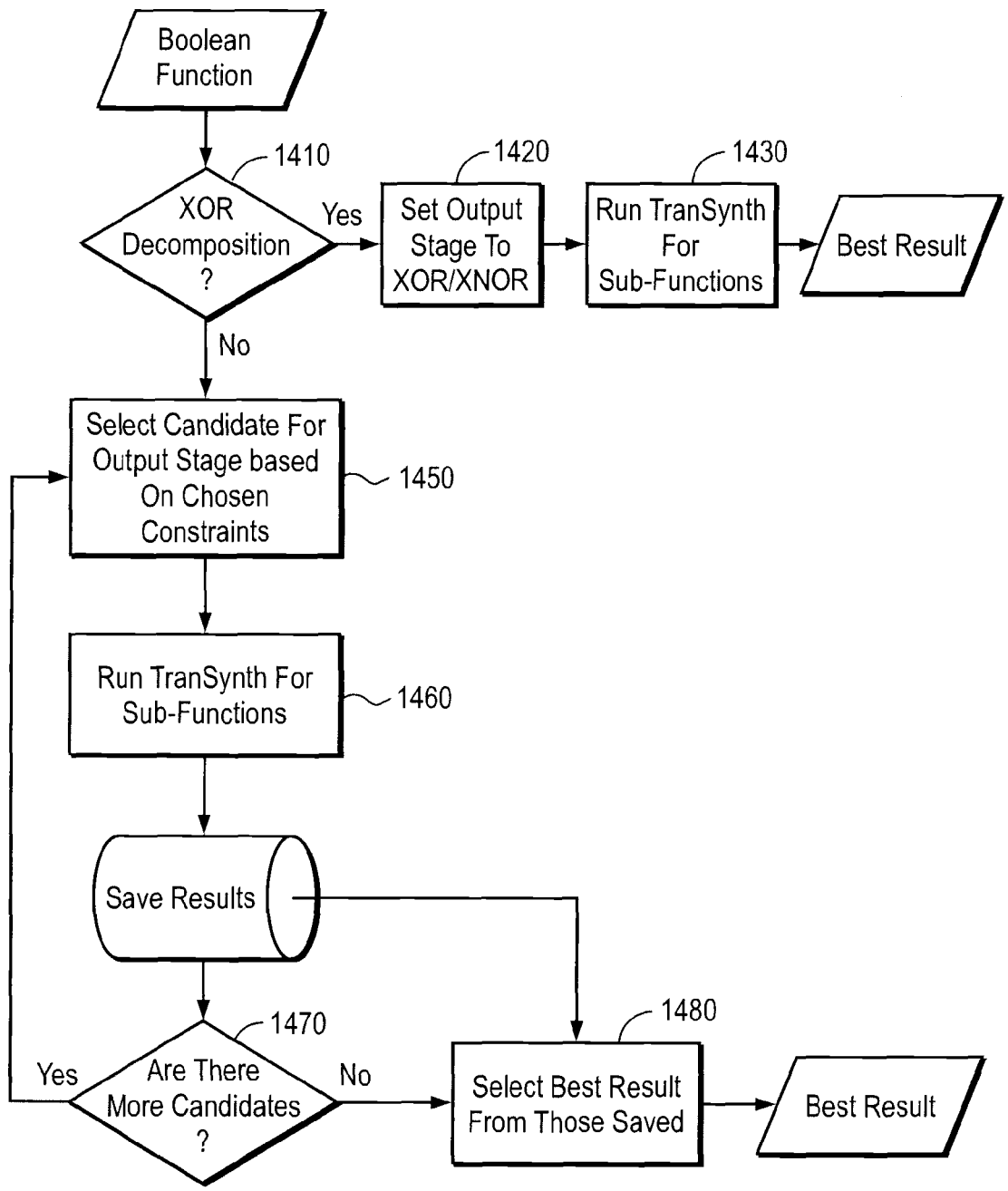
FIG. 14 illustrates an overview of the algorithm that recursively decomposes Boolean functions according to the present invention.

The TranSynth-2 flow starting from a Boolean logic function is shown in FIG. 14. The first step 1410 is consideration of an XOR decomposition, which step can also include the minimal gate algorithm described previously, if desired. If there is a naturally occurring XOR decomposition visible from the Binary Decision Diagram implementation of the function, then an XOR gate is selected as the top level gate, as shown at step 1420. This will yield two or more simplifying sub-functions. The number of subfunctions is equal to the number of inputs to the XOR gate. Each of these sub-functions can then be synthesized using TranSynth-1 or recursively decomposed using TranSynth-2, as shown at step 1430, in order to obtain the best results.

If an XOR decomposition does not naturally exist for the function, as determined by step 1410, then a gate is selected in step 1450 that satisfies all of the chosen constraints such as stack height, electrical constraints or layout constraints. The tree decomposition algorithm can explicitly limit the stack height. Other electrical or layout constraints can be met by either disallowing or penalizing inferior gates explicitly. The one or more sub-functions that are the inputs to the chosen gate can then be synthesized as shown in step 1460 using TranSynth-1 or recursively decomposed using TranSynth-2, to obtain saved results. Once the sub-functions are synthesized, the circuit can be evaluated based on a set of metrics and the metric values and circuit stored. Once all possible candidate gates have been considered as the top level gate that satisfies the chosen constraints, as shown at step 1470, the best implementation is selected as shown in step 1480 as that with the best overall quality measure (e.g. minimum number of transistors or smallest area), depending on the determined quality measure that is input to the transyth algorithm.

Figure 15:
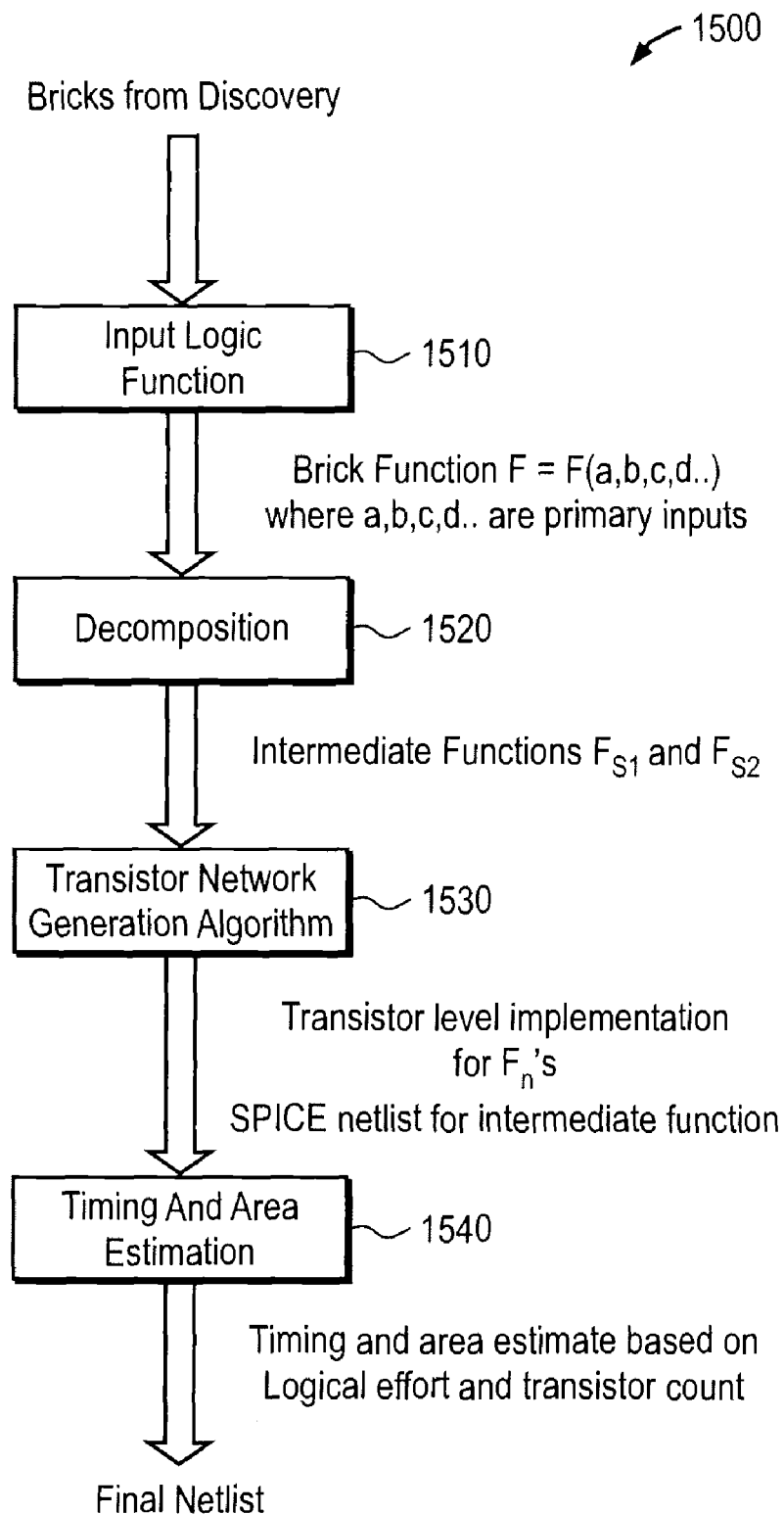
FIG. 15 shows an overview of one transistor level synthesis algorithm flowchart according to another embodiment of the present invention.

FIG. 15 shows the overall flow 1500 of the TransSynth 2 methodology. As shown in FIG. 15, each Logical Brick, shown as the input logic function in block 1510, is decomposed as described above in step 1520. The logical gate level netlist obtained is then transformed into a static CMOS transistor level netlist using simple substitution, as shown at block 1530. Transistor sizing and timing estimation use a logical effort based algorithm, as shown at block 1540. As discussed earlier, a lower bound area estimate can be derived from the transistor count. The final result is either a TL Brick netlist suitable for further implementation or an area and timing estimate which can be used within Brick Discovery.

TranSynth-3

One last modification to the TranSynth methodology is the use of design templates to increase the accuracy for timing and area modeling. Design Templates are precharacterized logic gates that can be used as building blocks for a TL Brick. In a stack height of 3, there are 69 useful Boolean functions that can be built, and from these useful Boolean functions an almost limitless set of TL bricks can be built. Because the templates are limited in number, each of these functions can be implemented in silicon and well-characterized in terms of timing and area.

67 of the 69 functions are most efficiently implemented utilizing a traditional static CMOS tree structure such as that found in the examples of FIG. 13. These functions, most of which are trees as mentioned above, are provided in the table below:

TABLE I

| #define OAI333 | 1 // !((A+B+C)(D+E+F)(G+H+I)) |
|---|---|
| #define AOI333 | 2 // !(ABC+DEF+GHI) |
| #define OAI332 | 3 // !((A+B+C)(D+E+F)(G+H)) |
| #define AOI332 | 4 // !(ABC+DEF+GH) |
| #define OAI331 | 5 // !((A+B+C)(D+E+F)G) |

TABLE I-continued

| | |
|---|---|
| #define AOI331 | 6 // !(ABC+DEF+G) |
| #define OAI33 | 7 // !((A+B+C)(D+E+F)) |
| #define AOI33 | 8 // !(ABC+DEF) |
| #define OAI32 | 9 // !((A+B+C)(D+E)) |
| #define AOI32 | 10 // !(ABC+DE) |
| #define OAI31 | 11 // !((A+B+C)D) |
| #define AOI31 | 12 // !(ABC+D) |
| #define NOR3 | 13 // !(A+B+C) |
| #define NAND3 | 14 // !(ABC) |
| #define NOR2 | 15 // !(A+B) |
| #define NAND2 | 16 // !(AB) |
| #define INV | 17 // !A |
| #define OAI322 | 18 // !((A+B+C)(D+E)(F+G)) |
| #define AOI322 | 19 // !(ABC+DE+FG) |
| #define OAI321 | 20 // !((A+B+C)(D+E)F) |
| #define AOI321 | 21 // !(ABC+DE+F) |
| #define OAI311 | 22 // !((A+B+C)DE) |
| #define AOI311 | 23 // !(ABC+D+E) |
| #define OAI222 | 24 // !((A+B)(C+D)(E+F)) |
| #define AOI222 | 25 // !(AB+CD+EF) |
| #define OAI221 | 26 // !((A+B)(C+D)E) |
| #define AOI221 | 27 // !(AB+CD+E) |
| #define OAI22 | 28 // !((A+B)(C+D)) |
| #define AOI22 | 29 // !(AB+CD) |
| #define OAI211 | 30 // !((A+B)CD) |
| #define AOI211 | 31 // !(AB+C+D) |
| #define OAI21 | 32 // !((A+B)C) |
| #define AOI21 | 33 // !(AB+C) |
| #define OA22OAI23 | 34 // !(((A+B)(C+D))+E)(F+G+H)) |
| #define AO22AOI23 | 35 // !(((AB+CD)E)+FGH) |
| #define OA22OAI22 | 36 // !(((A+B)(C+D))+E)(F+G)) |
| #define AO22AOI22 | 37 // !(((AB+CD)E)+FG) |
| #define OA22OAI21 | 38 // !(((A+B)(C+D))+E)F) |
| #define AO22AOI21 | 39 // !(((AB+CD)E)+F) |
| #define OA22NOR2 | 40 // !(((A+B)(C+D))+E) |
| #define AO22NAND2 | 41 // !((AB+CD)E) |
| #define OA21OAI23 | 42 // !(((A+B)C)+D)(E+F+G)) |
| #define AO21AOI23 | 43 // !(((AB+C)D)+EFG) |
| #define OA21OAI22 | 44 // !(((A+B)C)+D)(E+F)) |
| #define AO21AOI22 | 45 // !(((AB+C)D)+EF) |
| #define OA21OAI21 | 46 // !(((A+B)C)+D)E) |
| #define AO21AOI21 | 47 // !(((AB+C)D)+E) |
| #define OA21NOR2 | 48 // !(((A+B)C)+D) |
| #define AO21NAND2 | 49 // !((AB+C)D) |
| #define AND2OAI23 | 50 // !((AB)+C)(D+E+F)) |
| #define OR2AOI23 | 51 // !((A+B)C)+DEF) |
| #define AND2OAI22 | 52 // !(((AB)+C)(D+E)) |
| #define OR2AOI22 | 53 // !(((A+B)C)+DE) |
| #define AND2OAI21 | 54 // !(((AB)+C)D) |
| #define OR2AOI21 | 55 // !(((A+B)C)+D) |
| #define OA222NOR2 | 56 // !((A+B)(C+D)(E+F))+G) |
| #define AO222NAND2 | 57 // !((AB+CD+EF)G) |
| #define OA221NOR2 | 58 // !(((A+B)(C+D)E)+F) |
| #define AO221NAND2 | 59 // !((AB+CD+E)F) |
| #define OR2AOI31 | 60 // !((A+B)CD)+E) |
| #define AND2OAI31 | 61 // !((AB+C+D)E) |
| #define AND2OAI33 | 62 // !(((AB)+C+D)(E+F+G)) |
| #define OR2AOI33 | 63 // !((A+B)CD)+EFG |
| #define AND2OAI32 | 64 // !(((AB)+C+D)(E+F)) |
| #define OR2AOI32 | 65 // !(((A+B)CD)+EF) |
| #define AND2OA22NOR2 | 66 // !(((AB+C)(D+E))+F) |
| #define OR2AO22NAND2 | 67 // !((((A+B)C)+(DE))F) |

To this set the following non-tree functions are added that also satisfy the 3-stack limit. We count this H-tree function, shown in FIG. 17 as a single template, although it can be used to form more than one logic function if one or more of the inputs are repeated. It should be further noted that such H-tree functions are extremely efficient implementations of some large logic functions, and thus significant.

Figure 17A:
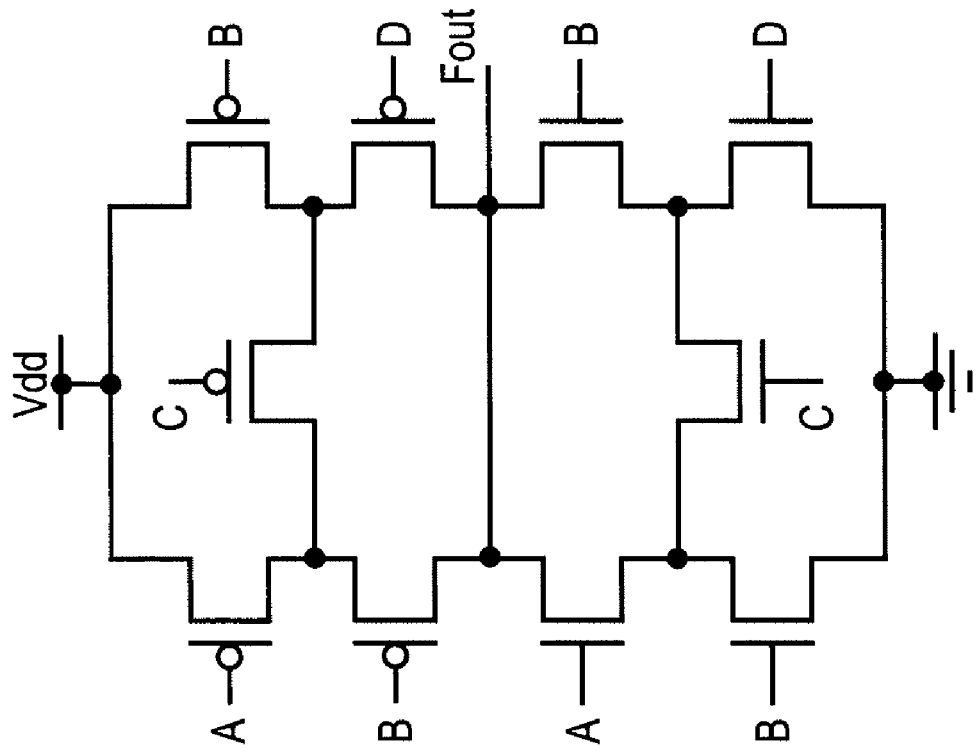
FIGS. 17(a)-(b) illustrate two H-tree functions that are used as design templates according to the present invention.
Figure 17B:
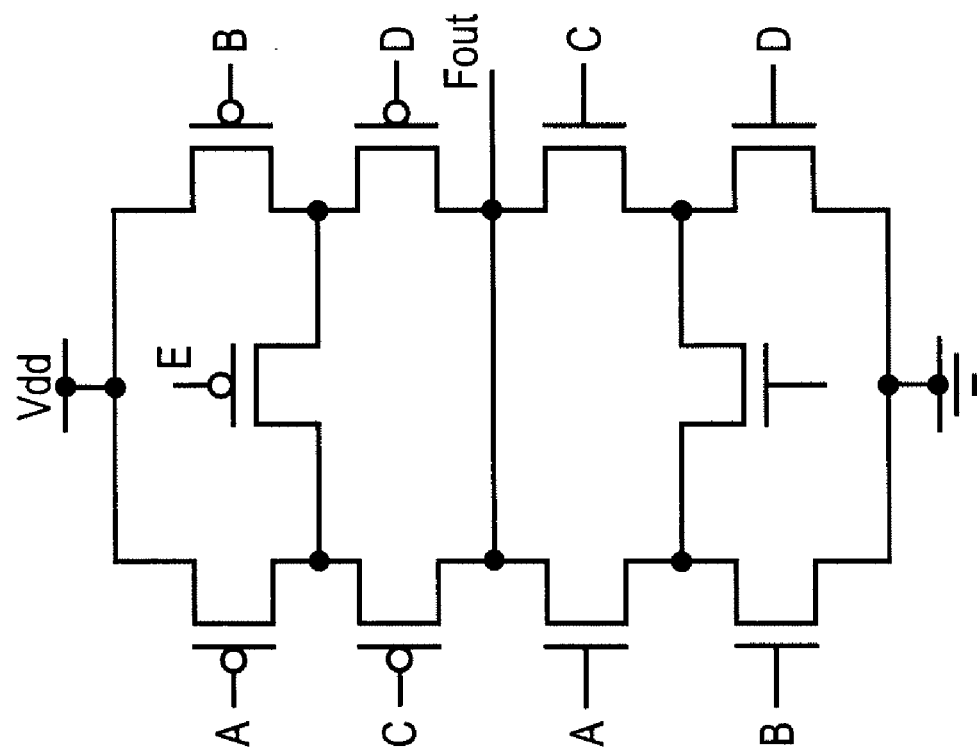

The other two functions are most efficiently implemented utilizing the H-Tree structures shown in FIG. 17. These structures can be found with the TransSyn-1 algorithm. In TranSyn-2, the currently employed algebraic tree decomposition algorithm can not find H-Trees except at the first logic stage (closest to the inputs). In TranSynth-3, when algebraic decomposition is replaced with Boolean division any template—tree-like or H-Tree can easily be found.

Figure 18:
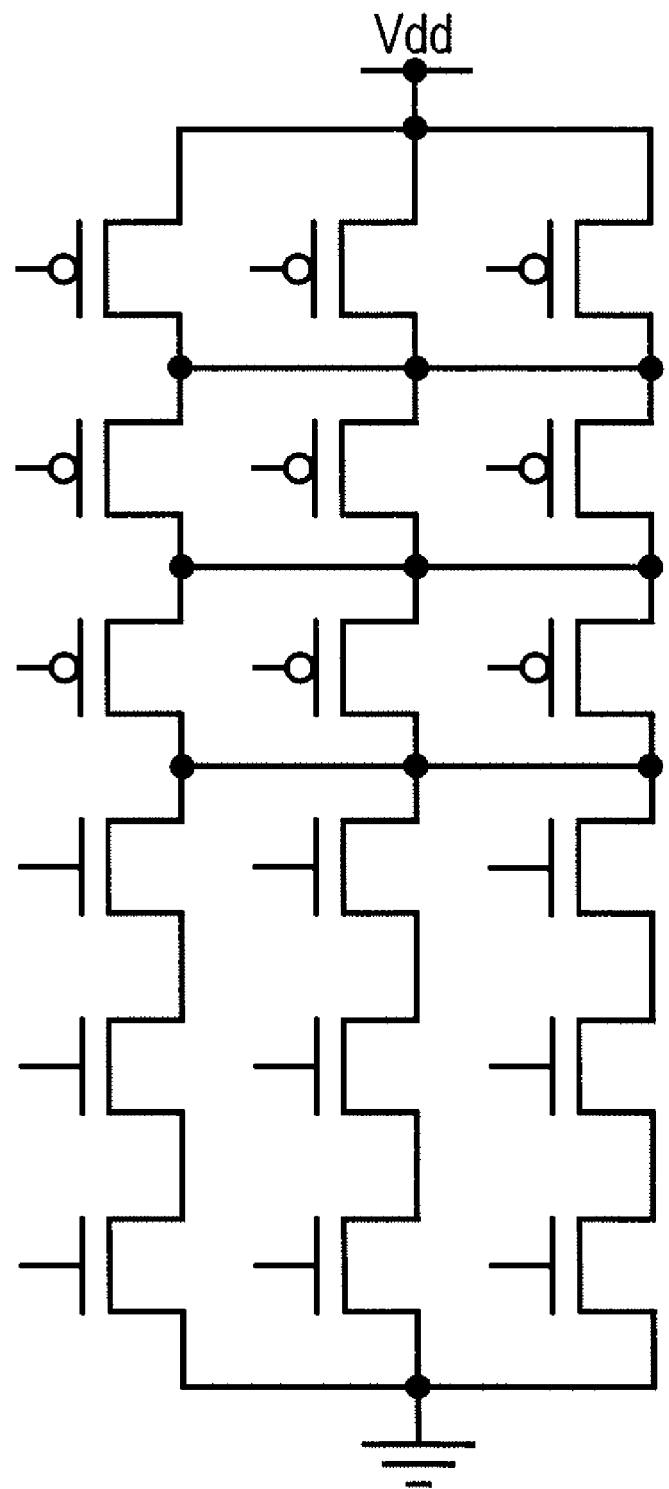
FIG. 18 illustrates an undesired high capacitance template.

The number of templates that are considered in TranSynth-3 can be reduced further when factors other than stack height are considered such as layout efficiency and electrical properties. The logical gate implemented in FIG. 18 could be removed from the considered template set because of high output capacitance that will result in poor timing.

Figure 16:
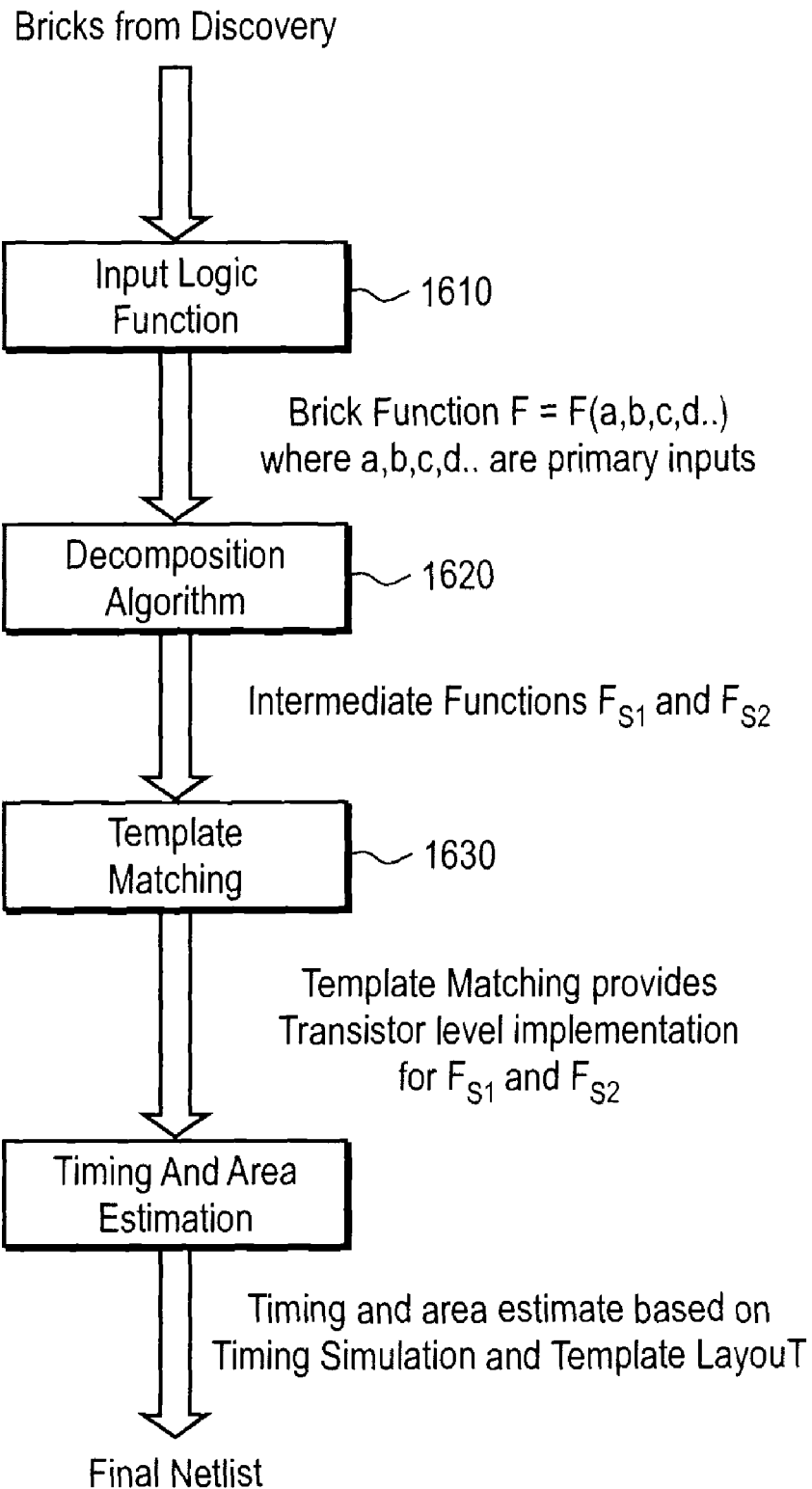
FIG. 16 shows an overview of one transistor level synthesis algorithm flowchart according to a further embodiment of the present invention.

FIG. 16 shows the overall flow 1600 of the TransSynth 3 methodology. As shown in FIG. 16, each Logical Brick, shown as the input logic function in block 1610, is decomposed as described above in step 1620, which step can also include the minimal gate algorithm described previously, if desired. The logical gate level netlist obtained is then transformed into a static CMOS transistor level netlist using template matching as described above and indicated at block 1630, wherein the functions that make up the circuit are substantially obtained from the design templates. By substantially obtained is intended that typically 100% of the transistors in the circuit for the TL brick are obtained from transistors that are in the design templates, though this aspect of the invention cannot be avoided merely by using some percentage, even up to 20%, of transistors from a source that is not the design templates as described herein. Transistor sizing and timing estimation use a logical effort based algorithm, as shown at block 1640. As discussed earlier, a lower bound area estimate can be derived from the transistor count. The final result is either a TL Brick netlist suitable for further implementation or an area and timing estimate which can be used within Brick Discovery.

Optimal TranSynth Implementation

The optimal TranSynth implementation for a given function is dependant on the stack height for a given technology. If the allowable stack height is greater than 3, TranSyn-1 can be sometimes more efficient because of the algebraic decomposition solution space explosion with TranSyn-2 and the exponential increase in templates of TranSyn-3

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. A method of determining a logic brick that contains a non-standard complex Boolean logic function that has at least three inputs using a computer comprising the steps of:
   determining a circuit that implements the non-standard complex Boolean logic function using the computer, the step of determining including the step of identifying transistors, associated connections and the at least three inputs to implement the circuit, the step of identifying reducing a number of the transistors to be a fewest possible that satisfy predetermined logic, layout and electrical constraints, and wherein the step of determining the circuit restricts the circuit to a stack depth of no more than 3; and
   determining a layout for the circuit to specify the logic brick using the computer.

2. The method according to claim 1 wherein the step of determining the circuit uses a minimal negative gate algorithm.

3. The method according to claim 1 wherein the step of determining the circuit uses a recursive decomposition and a template matching, wherein the template matching requires that the circuit is substantially obtained from design templates used in the template matching, and wherein each of the design templates are restricted to having a stack depth of no more than 3.

4. The method according to claim 1 wherein the step of identifying reduces a number of the transistors to be the fewest possible after the step of determining (a) uses a minimal gate algorithm, (b) finds a set of Don't Cares that minimizes transistor count, and (3) ensures that the selected transistors are achieved at or below a pre-specified stack height restriction.

5. The method according to claim 1 wherein one of the predetermined electrical constraints is stack height, one of the predetermined logic constraints is a selected type of logic.

6. The method according to claim 5 wherein one of the predetermined logic constraints is a logic family that does not include pass transistors.

7. The method according to claim 6 wherein one of the predetermined layout constraints is using a merged diffusion region for at least some of the transistors.

8. The method according to claim 1 wherein one of the predetermined layout constraints is using a merged diffusion region for at least some of the transistors.

9. The method according to claim 1 wherein one of the predetermined logic constraints is a logic family that does not include pass transistors.

10. A method of determining a logic brick that contains a non-standard complex Boolean logic function that has at least three inputs using a computer comprising the steps of:

determining a circuit that implements the non-standard complex Boolean logic function using the computer, the step of determining including the step of identifying transistors, associated connections and the at least three inputs to implement the circuit, the step of identifying reducing a number of the transistors to be a fewest possible that satisfy predetermined logic, layout and electrical constraints, and wherein the step of determining the circuit uses a recursive decomposition to select an output function for the circuit, and wherein a stack height of the output function is no more than 2; and determining a layout for the circuit to specify the logic brick using the computer.

11. The method according to claim 10 wherein the step of determining the circuit uses a recursive decomposition and a template matching, wherein the template matching requires that the circuit is substantially obtained from design templates used in the template matching, and wherein each of the design templates are restricted to having a stack depth of no more than 3.

12. The method according to claim 10 wherein the step of identifying reduces a number of the transistors to be the fewest possible after the step of determining (a) uses a minimal gate algorithm, (b) finds a set of Don't Cares that minimizes transistor count, and (3) ensures that the selected transistors are achieved at or below a pre-specified stack height restriction.

13. The method according to claim 10 wherein one of the predetermined electrical constraints is stack height, one of the predetermined logic constraints is a selected type of logic.

14. The method according to claim 13 wherein one of the predetermined logic constraints is a logic family that does not include pass transistors.

15. The method according to claim 14 wherein one of the predetermined layout constraints is using a merged diffusion region for at least some of the transistors.

16. The method according to claim 10 wherein one of the predetermined layout constraints is using a merged diffusion region for at least some of the transistors.

17. The method according to claim 10 wherein one of the predetermined logic constraints is a logic family that does not include pass transistors.

18. The method according to claim 10 wherein the step of determining the circuit uses a minimal negative gate algorithm.

* * * * *